(12) United States Patent  
Chen (10) Patent No.: US 7,948,767 B2
(45) Date of Patent: May 24, 2011

(54) INTEGRATED CIRCUIT PACKAGING STRUCTURE AND METHOD OF MAKING THE SAME

(75) Inventor: Jen-Shyan Chen, Hsinchu (TW)

(73) Assignee: Neobulb Technologies, LLP., Brunei Darussalam ( * ) Notice: Subject to any disclaimer, the term of this patent is extended or adjusted under 35 U.S.C. 154(b) by 0 days.

(21) Appl. No.: 12/709,359

(22) Filed: Feb. 19, 2010

(65) Prior Publication Data

US 2010/0140791 A1 Jun. 10, 2010

Related U.S. Application Data

(62) Division of application No. 11/417,047, filed on May 4, 2006, now abandoned.

(30) Foreign Application Priority Data

May 6, 2005 (TW) .............................. 94114755 A (51) Int. Cl.
*H05K 1/18* (2006.01)
(52) U.S. Cl. ........ 361/761; 361/688; 361/689; 361/701; 361/704; 361/707; 361/709; 361/719; 257/659; 257/722; 257/713; 257/719; 174/521; 174/528; 174/548; 165/104.26
(58) Field of Classification Search .................. 361/688, 361/689, 699–704, 707–710, 719, 761; 257/659, 257/722, 713, 719; 174/521, 528, 548; 165/104.26
See application file for complete search history.

(56) References Cited

U.S. PATENT DOCUMENTS

| 3,862,481 | A | | 1/1975 | Van Geenen |
| 4,633,371 | A | | 12/1986 | Nagy et al. |
| 5,294,831 | A | | 3/1994 | Tao et al. |
| 5,371,404 | A | | 12/1994 | Juskey et al. |
| 5,465,782 | A | | 11/1995 | Sun et al. |
| 5,471,366 | A | * | 11/1995 | Ozawa ......................... 361/704 |
| 5,615,086 | A | * | 3/1997 | Collins et al. ................. 361/704 |
| 5,740,019 | A | | 4/1998 | Lee |
| 5,847,929 | A | | 12/1998 | Bernier et al. |
| 6,028,770 | A | | 2/2000 | Kerner et al. |
| 6,147,869 | A | | 11/2000 | Furnival |
| 6,219,243 | B1 | * | 4/2001 | Ma et al. ....................... 361/704 |
| 6,229,702 | B1 | | 5/2001 | Tao et al. |
| 6,304,451 | B1 | | 10/2001 | Rife |

(Continued)

FOREIGN PATENT DOCUMENTS

CN 2422727 Y 3/2001

(Continued)

*Primary Examiner* — Xiaoliang Chen
(74) *Attorney, Agent, or Firm* — Thomas, Kayden, Horstemeyer & Risley, LLP.

(57) ABSTRACT

The invention provides an integrated circuit packaging and method of making the same. The integrated circuit packaging includes a substrate, a semiconductor die, a heat-dissipating module, and a protection layer. The substrate has an inner circuit formed on a first surface, and an outer circuit formed on a second surface and electrically connected to the inner circuit. The semiconductor die is mounted on the first surface of the substrate such that the plurality of bond pads contact the inner circuit. The heat-dissipating module includes a heat-conducting device, and the heat-conducting device, via a flat end surface thereof, contacts and bonds with a back surface of the semiconductor die. The protection layer contacts a portion of the first surface of the substrate and a portion of the heat-conducting device, such that the semiconductor die is encapsulated therebetween.

5 Claims, 10 Drawing Sheets

U.S. PATENT DOCUMENTS

| | | |
|---|---|---|
| 6,362,964 B1 | 3/2002 | Dubhashi et al. |
| 6,442,026 B2 | 8/2002 | Yamaoka |
| 6,819,566 B1 | 11/2004 | Danovitch et al. |
| 6,867,974 B2 | 3/2005 | Luo |
| 7,028,759 B2 * | 4/2006 | Rosenfeld et al. ....... 165/104.26 |
| 2003/0121645 A1 | 7/2003 | Wang |
| 2003/0147215 A1 * | 8/2003 | Weng ............................ 361/700 |
| 2005/0201060 A1 * | 9/2005 | Huang ........................ 361/700 |

FOREIGN PATENT DOCUMENTS

| | | |
|---|---|---|
| CN | 1387252 A | 12/2002 |
| CN | 2572461 Y | 9/2003 |
| JP | 5-275580 | 10/1993 |
| JP | 6-268122 | 9/1994 |

* cited by examiner

INTEGRATED CIRCUIT PACKAGING STRUCTURE AND METHOD OF MAKING THE SAME

This application is a Continuation of co-pending application Ser. No. 11/417,047 filed on May 4, 2006, the entire contents of which are hereby incorporated by reference and for which priority is claimed under 35 U.S.C. §120. This nonprovisional application also claims priority under 35 U.S.C. §119(a) on Patent Application Ser. No. 094114755 filed in Taiwan on May 6, 2005, the entirety of which is herein incorporated by reference.

BACKGROUND OF THE INVENTION

1. Field of the Invention

The present invention relates to an integrated circuit (IC) packaging structure and a method of making the same, and more particularly, the IC packaging structure according to the invention includes a heat-dissipating module.

2. Description of the Prior Art

Heat dissipating has always been a prerequisite consideration for the design of electronic systems to decrease the chances of a breakdown or destruction on an electric device caused by overheating, so as to improve the reliability of the whole system.

For current ICs, especially for CPU in computers, the technique for heat dissipation usually involves using a metal with high thermal conductivity as the basic heat-dissipating material and combining heat-dissipating fins and a powerful fan to fit the request of heat dissipating for the current ICs.

Figure 1A:
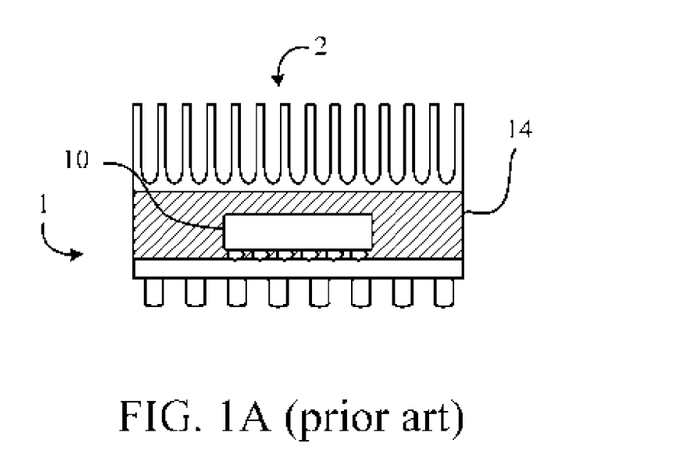
FIG. 1A and FIG. 1B illustrate the IC packing structure of current integrated heat-dissipating devices.
Figure 1B:
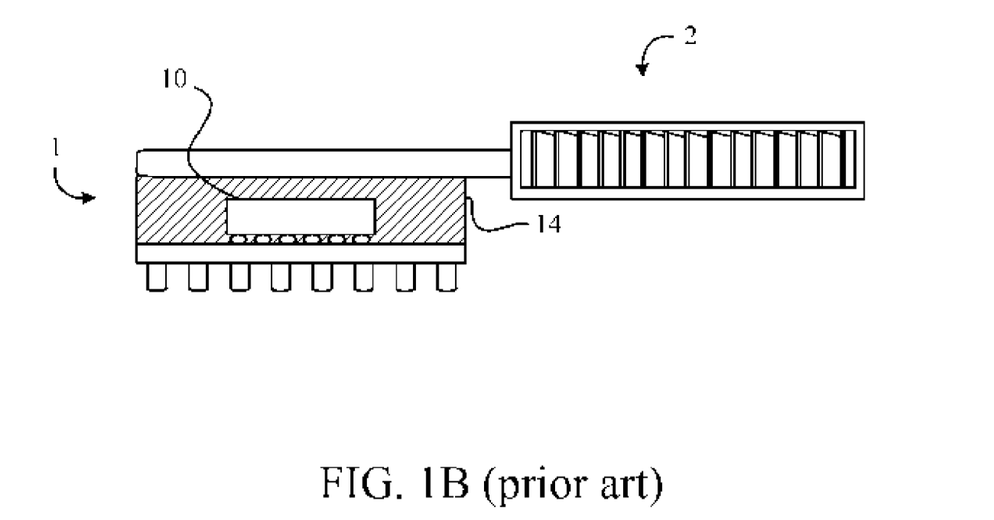

In the current heat-dissipating techniques, most of the heat-dissipating modules are configured on the casings of the packaged IC. Referring to FIG. 1A and FIG. 1B, FIG. 1A and FIG. 1B illustrate samples of current IC packaging structure configured with a heat-dissipating device. As shown in FIG. 1A and FIG. 1B, the heat produced by a chip 10 of an IC packaging structure 1 is conducted through a conducting layer 14 to a heat-dissipating module 2. Because the heat produced by the chip is dissipated by means of conducting through multilayer materials, not by means of directly contacting the heat dissipating module, the heat can not be quickly dissipated, and the problem of heat concentration caused by hot spots cannot be efficiently solved. Therefore, the heat-dissipating efficiency of a chip cannot be precisely controlled, and the performance of the IC is lowered due to overheating.

As the concept of mobile information arises, thin and small mobile products with high calculating performance are the mainstream. The technique for heat dissipating faces the challenge of products boasting characters of miniature, integration, high heat-dissipating capability, and high energy density. The current technique for heat dissipation is gradually failing to fulfill the demands of heat dissipation in new products. Especially for partial heat concentration of a chip, called hot spot issue, there is a need for new heat-dissipating techniques to solve these problems.

Accordingly, the invention provides an IC packaging structure therein integrated with a heat-dissipating module, which reduces the thermal resistance of the chip at the packaging stage to dissipate heat and effectively lower the temperature of the chip during operation. According to the invention, the IC packing structure can overcome the heat-dissipating problem and quickly conduct the heat produced by the chip to solve the hot spot issue.

SUMMARY OF THE INVENTION

The present invention provides an IC packing structure and a method of making the same to achieve the above goal and solve the discussed issue.

According to a first preferred embodiment of the invention, the IC packing structure includes a substrate, a semiconductor die, a heat-dissipating module, and a protection layer. The substrate has a first surface, an inner circuit formed on the first surface, a second surface opposite to the first surface, and an outer circuit formed on the second surface. The outer circuit is electrically connected to the inner circuit. The semiconductor die has an active surface, a plurality of bond pads formed on the active surface, and a back surface opposite to the active surface. The semiconductor die is mounted on the first surface of the substrate, such that the plurality of bond pads contact the inner circuit. The heat-dissipating module includes a heat-conducting device which has a flat end surface. The heat-conducting device, via the flat end surface thereof, contacts and bonds with the back surface of the semiconductor die. The protection layer contacts a portion of the first surface of the substrate and a portion of the heat-conducting device, such that the semiconductor die is encapsulated therebetween.

According to the first preferred embodiment of the invention, the method of making the IC packing structure is to prepare a substrate, a semiconductor, and a heat-dissipating module. The substrate has a first surface, an inner circuit formed on the first surface, a second surface opposite to the first surface, and an outer circuit formed on the second surface. The outer circuit is electrically connected to the inner circuit. The semiconductor die has an active surface, a plurality of bond pads formed on the active surface, and a back surface opposite to the active surface. The heat-dissipating module includes a heat-conducting device which has a flat end surface at a distal end thereof.

The method is, first, to mount the semiconductor die on the first surface of the substrate, such that the plurality of bond pads contact the inner circuit. In the method, a protection layer is also formed to contact a portion of the substrate. The protection layer has an opening adapted to accommodate the flat end surface of the heat-conducting device. Furthermore, the distal end of the heat-conducting device is disposed into the opening of the protection layer, so the flat end surface of the heat-conducting device contacts and bonds with the back surface of the semiconductor die to complete the IC packing structure.

According to a second preferred embodiment of the invention, an IC packing structure includes a substrate, a protection layer, a semiconductor die, and a heat-dissipating module. The substrate has a first surface, an inner circuit formed on the first surface, a second surface opposite to the first surface, and an outer circuit formed on the second surface. The outer circuit is electrically connected to the inner circuit. The protection layer is formed on the first surface of the substrate. The protection layer has an opening where the inner circuit is disposed. The semiconductor die has an active surface, a plurality of bond pads formed on the active surface, and a back surface opposite to the active surface. The semiconductor die is mounted in the opening of the protection layer such that the plurality of bond pads contact the inner circuit, and a gap exist between the semiconductor die and the protection layer. The heat-dissipating module includes a heat-conducting device which has a flat end surface at a distal end thereof. The heat-conducting device, via the distal end of the heat-conducting device, is inserted into the opening of the protection layer, and the flat end surface thereof contacts and bonds with the back surface of the semiconductor die.

According to the second preferred embodiment of the invention, the method of making the IC packing structure is to prepare a substrate and a semiconductor. The substrate has a first surface, an inner circuit formed on the first surface, a second surface opposite to the first surface, and an outer circuit formed on the second surface. The outer circuit is electrically connected to the inner circuit. The semiconductor has an active surface, a plurality of bond pads formed on the active surface, and a back surface opposite to the active surface.

The method is, first, to form a protection layer. The protection layer contacts a portion of the first surface of the substrate, which has an opening where the inner circuit is disposed. Then, the semiconductor die is mounted in the opening of the protection layer such that the plurality of bond pads contact the inner circuit, and a gap exists between the semiconductor die and the protection layer. The distal end of the heat-dissipating module is further disposed into the opening of the protection layer. The heat-dissipating module includes a heat-conducting device which has a flat end surface at a distal thereof. Finally, the flat end surface of the heat-conducting device contacts and bonds with the back surface of the semiconductor die to complete the IC packing structure.

Because the IC packing structure of the invention bonds the heat-dissipating module with the semiconductor die, the heat-conducting device directly conducts the heat produced by the semiconductor die to the surrounding air via the fins. This not only solves the hot spot issue, but also greatly improves the heat-dissipating efficiency. The IC packing structure further integrates other heat-dissipating techniques to achieve a better effect of heat dissipating. Therefore, comparing with the prior art, the IC packing structure of the invention is more suitable for the application of high power semiconductor devices.

The advantage and spirit of the invention may be understood by the following recitations together with the appended drawings.

DETAILED DESCRIPTION OF THE INVENTION

A scope of the present invention provides an IC packing structure.

Figure 2:
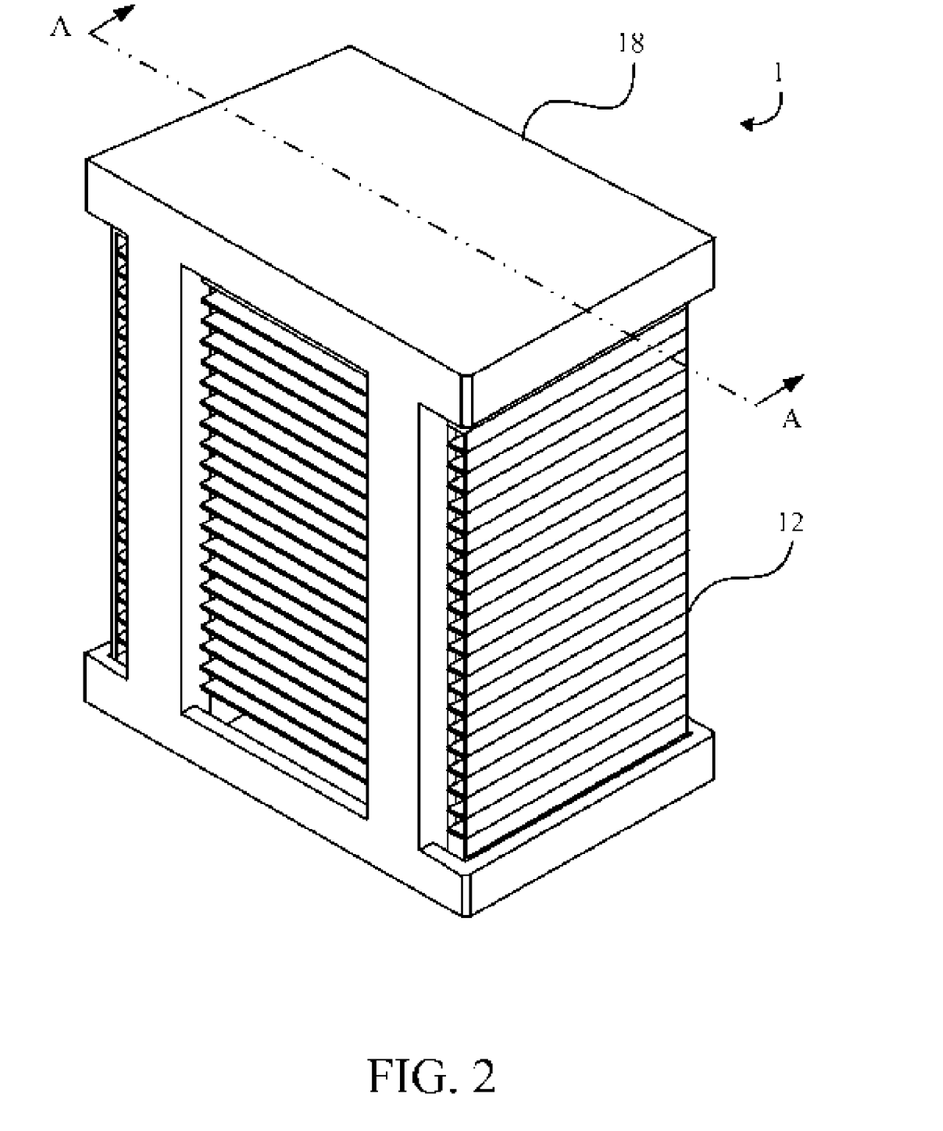
FIG. 2 illustrates an outward view of the IC packing structure of the present invention.

Referring to FIG. 2, FIG. 2 illustrates an outward view of the IC packing structure of the invention. As shown in FIG. 2, the IC packing structure 1 includes a heat-dissipating module 12 and a casing 18.

Figure 3:
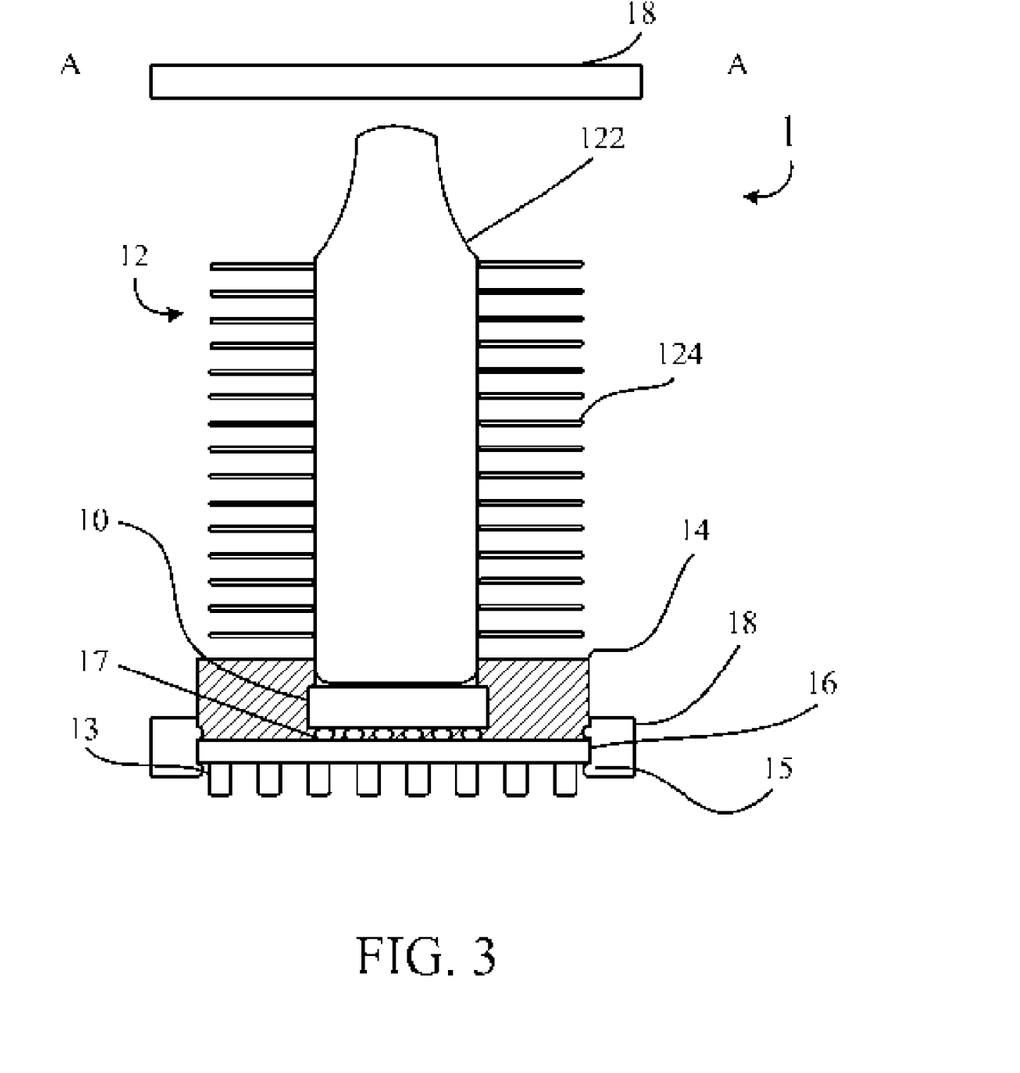
FIG. 3 is a cross-sectional diagram along the A-A line in FIG. 2, illustrating the IC packing structure of the first embodiment of the present invention.

Referring to FIG. 3, FIG. 3, a cross-sectional diagram along the A-A line in FIG. 2, illustrates a first preferred embodiment according to the IC packing structure of the invention. As shown in FIG. 3, according to the first preferred embodiment of the invention, the IC packing structure 1 further comprises a semiconductor die 10, a substrate 16, and a protection layer 14. In the first preferred embodiment, the semiconductor die can be a high power semiconductor device.

The substrate 16 has a first surface, an inner circuit formed on the first surface, a second surface opposite to the first surface, and an outer circuit 13 formed on the second surface. The outer circuit 13 is electrically connected to the inner circuit. The semiconductor 10 has an active surface, a plurality of bond pads 17 formed on the active surface, and a back surface opposite to the active surface. The semiconductor die 10 is mounted on the first surface of the substrate 16 by a flip-chip process, such that the plurality of bond pads 17 contact and are electrically connected to the inner circuit.

The heat-dissipating module 12 includes a heat-conducting device 122 and a plurality of heat-dissipating fins 124. The heat-conducting device 122 can be a heat pipe, a heat column, or a column made of a material with high thermal conductivity. The heat-conducting device 122 has a flat end, and the heat-dissipating fins 124 are disposed around its circumference to enhance heat dissipating. The heat-conducting device 122, via the flat end surface thereof, contacts and bonds with the back surface of the semiconductor die 10. The protection layer 14 contacts a portion of the first surface of the substrate 16 and a portion of the heat-conducting device 122, such that the semiconductor die 10 is encapsulated therebetween. The casing 18 is capable of enclosing the heat-dissipating module 12, the protection layer 14, and the substrate 16. In practical application, other heat-dissipating devices can be configured on the top surface of the casing, or a fan can be configured on a side of the IC packing structure 1.

According to the first preferred embodiment of the IC packing structure of the invention, the method of making the IC packing structure will be described in detail as follows. Referring to FIGS. 4A through 4D, FIGS. 4A through 4D illustrate the process of the IC packing structure according to the first preferred embodiment of the invention.

First, a substrate 16 and a semiconductor die 10 are prepared. The substrate 16 has a first surface, an inner circuit formed on the first surface, a second surface opposite to the first surface, and an outer circuit 13 formed on the second surface. The outer circuit 13 is electrically connected to the inner circuit. The semiconductor die 10 has an active surface, a plurality of bond pads 17 on the active surface, and a back surface opposite to the active surface. The heat-dissipating module 12 includes a heat-conducting device 122 which has a flat end surface at a distal thereof.

Figure 4A:
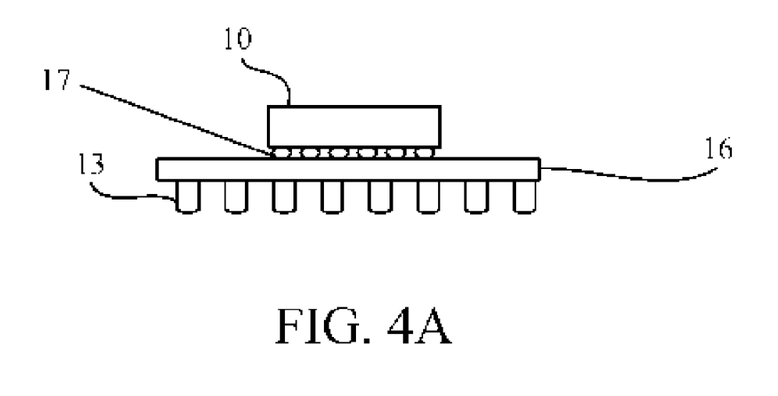
FIGS. 4A through 4D illustrate the process of the IC packing structure according to the first preferred embodiment of the present invention.
Figure 4B:
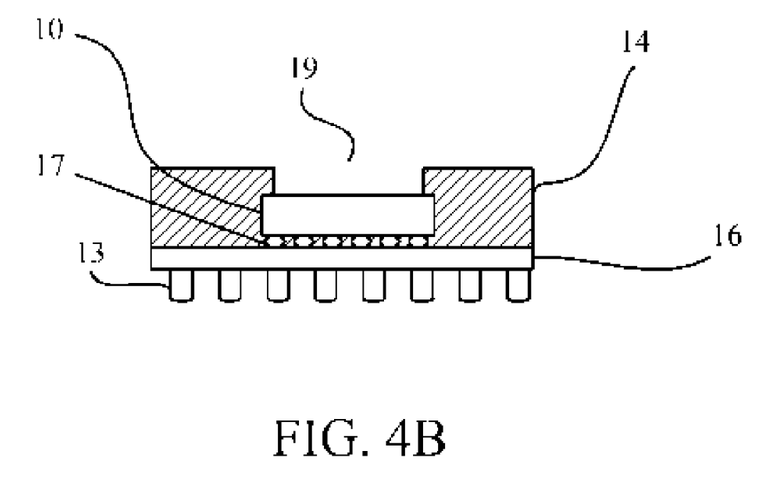
Figure 4C:
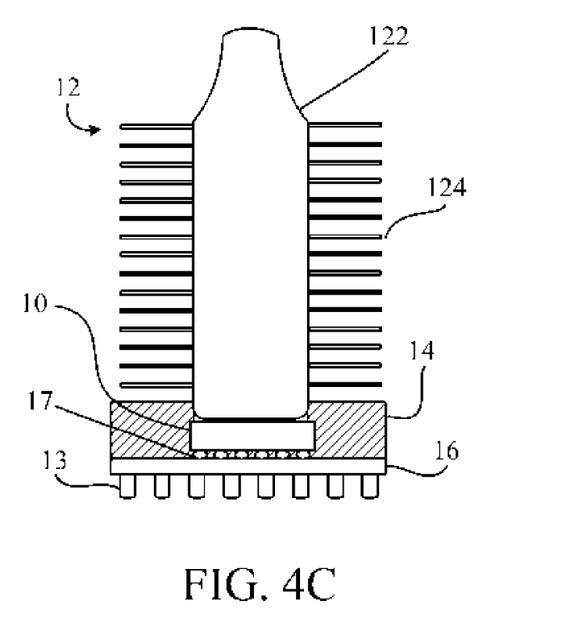
Figure 4D:
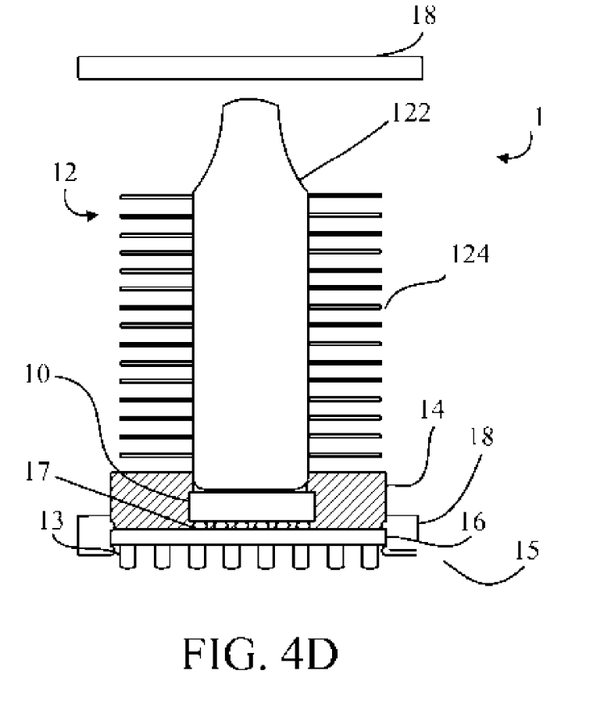

Referring to FIG. 4A, as shown in FIG. 4A, the semiconductor die 10 is mounted on the first surface of the substrate 16 by a flip-chip process, such that the plurality of bond pads 17 contact the inner circuit on the substrate 16. Then, as shown in FIG. 4B, a protection layer 14 is formed to cover a portion of the substrate 10. Moreover, the protection layer 14 has an opening 19 adapted to accommodate the flat end surface of the heat-conducting device 122. As shown in FIG. 4C, the distal end of the heat-conducting device 122 is disposed into the opening 19, and the flat end surface of the heat-conducting device 122 contacts and bonds with the back surface of the semiconductor die 10. The heat-dissipating module 12 further includes a plurality of heat-dissipating fins 124, which are disposed around the circumference of the heat-conducting device 122 to assist heat dissipating. Finally, as shown in FIG. 4D, a casing 18 encloses the heat-dissipating module 12, the protection layer 14, and the substrate 16 to complete the IC packing structure 1.

Figure 5:
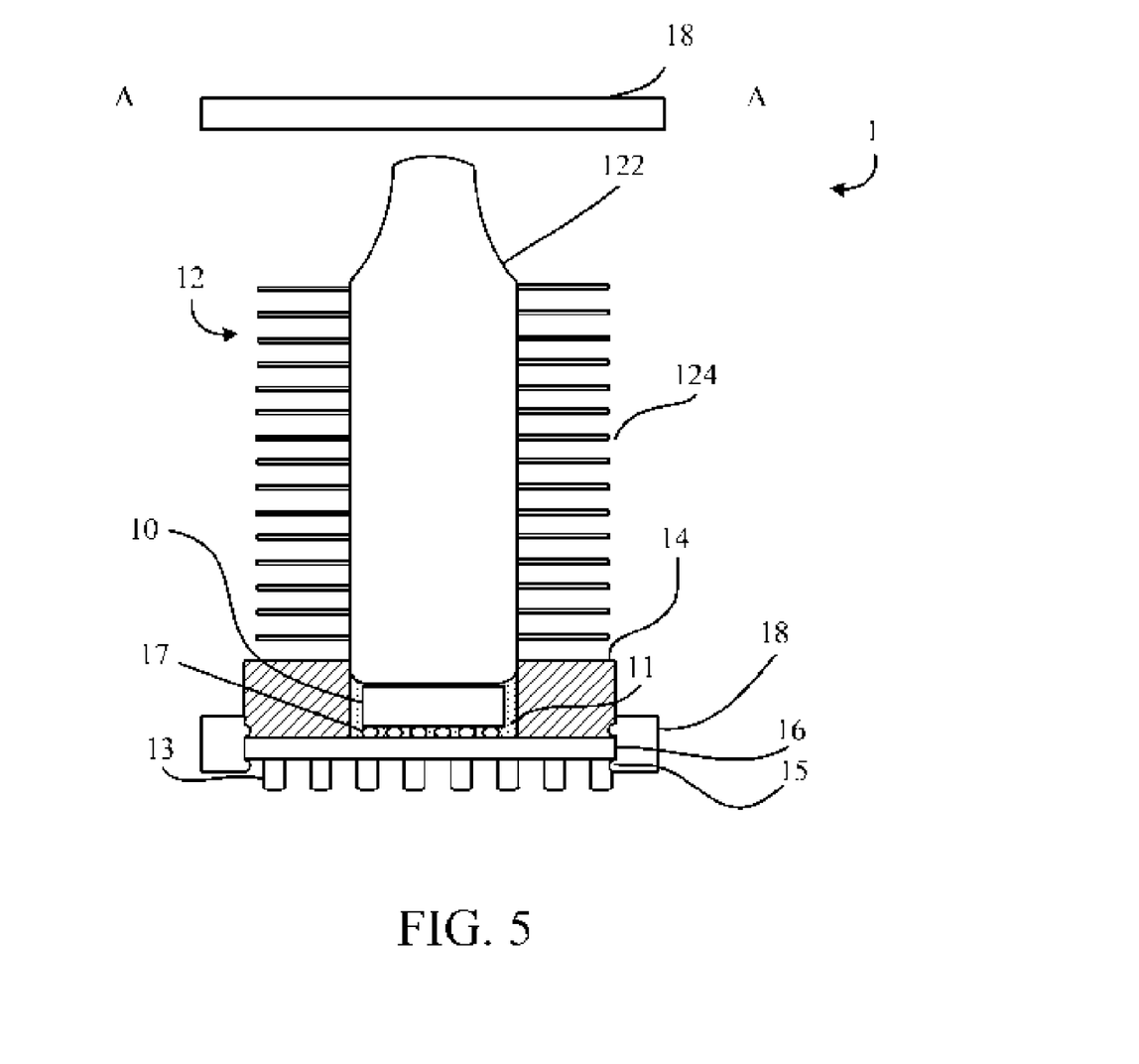
FIG. 5 is a cross-sectional diagram along the A-A line in FIG. 2, illustrating the IC packing structure of the second embodiment of the present invention.

Referring to FIG. 5, FIG. 5, a cross-sectional diagram along the A-A line in FIG. 2, illustrates the IC packing structure according to a second preferred embodiment of the invention. As shown in FIG. 5, according to the second preferred embodiment of the invention, the IC packing structure 1 further includes a semiconductor die 10, a substrate 16, and a protection 14. In the second preferred embodiment, the semiconductor die can be a high power semiconductor device.

The substrate 16 has a first surface, an inner circuit formed on the first surface, a second surface opposite to the first surface, an outer circuit 13 formed on the second surface. The outer circuit 13 is electrically connected to the inner circuit. The protection layer 14 is formed on the first surface of the substrate 16. The protection layer 14 has an opening of which the area is substantially equal to that of the end surface of the heat-dissipating module. The inner circuit is disposed and exposed in the opening. The semiconductor 10 has an active surface, a plurality of bond pads 17 formed on the active surface, and a back surface opposite to the active surface. The semiconductor die 10 is mounted in the opening of the protection layer 14 by a flip-chip process, such that the plurality of bond pads 17 contact the inner circuit on the first surface of the substrate 16. Since the area of the end surface of the heat-dissipating module 12 is larger than that of the back surface of the semiconductor die 10, a gap 11 exists between the semiconductor die 10 and the protection layer 14. Thermal adhesive is used to fill up the gap 11 between the semiconductor die 10 and the protection layer 14 to enhance heat dissipating. The heat-dissipating module 12 includes a heat-conducting device 122 and a plurality of heat-dissipating fins 124. The heat-conducting device 122 has a flat surface at a distal end thereof. The heat-conducting device 122, via the distal end thereof, is inserted into the opening of the protection layer 14, and the flat end surface thereof contacts and bonds with the back surface of the semiconductor die 10. The heat-dissipating fins 124 are disposed around the circumference of the heat-conducting device 122 to enhance heat dissipating. The casing 18 is capable of enclosing the heat-dissipating module 12, the protection layer 14, and the substrate 16.

According to the second preferred embodiment of the IC packing structure of the invention, the method of making the IC packing structure will be described in detail as follows. Referring to FIGS. 6A through 6E, FIGS. 6A through 6E illustrate the process of the IC packing structure according to the second preferred embodiment of the invention.

First, a substrate 16 and a semiconductor die 10 are prepared. The substrate 16 has a first surface, an inner circuit formed on the first surface, a second surface opposite to the first surface, and an outer circuit 13 formed on the second surface. The outer circuit 13 is electrically connected to the inner circuit. The semiconductor die 10 has an active surface, a plurality of bond pads 17 formed on the active surface, and a back surface opposite to the active surface.

Figure 6A:
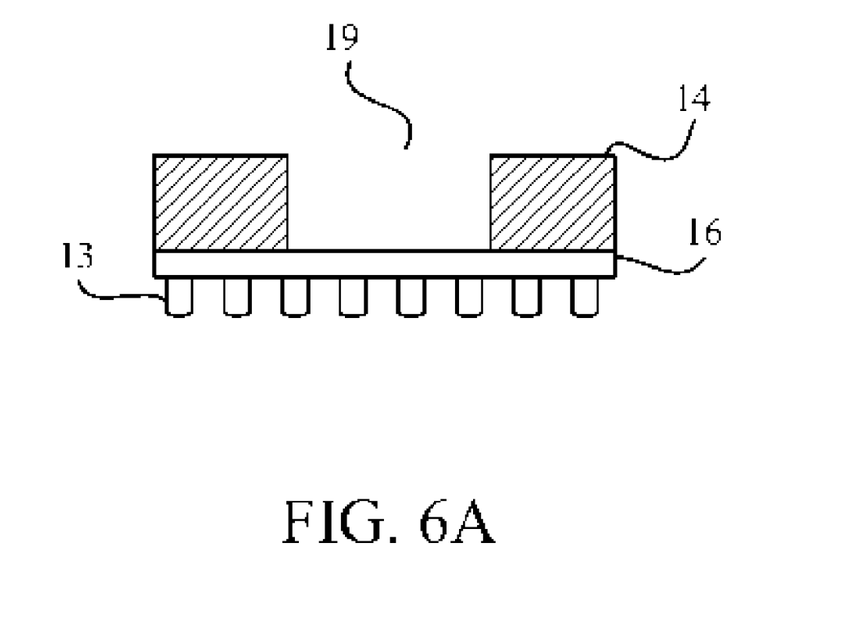
FIGS. 6A through 6E illustrate the process of the IC packing structure according to the second preferred embodiment of the present invention.
Figure 6B:
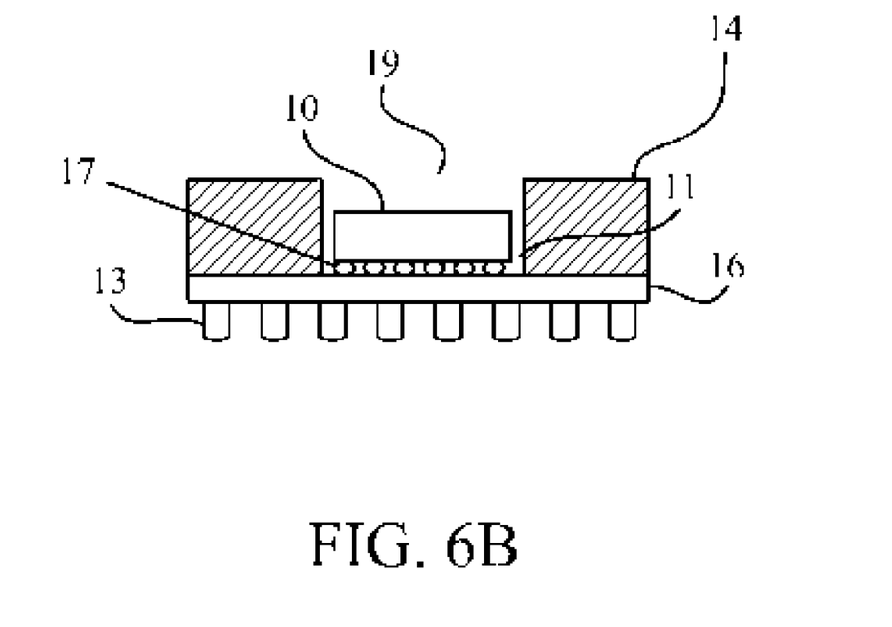
Figure 6C:
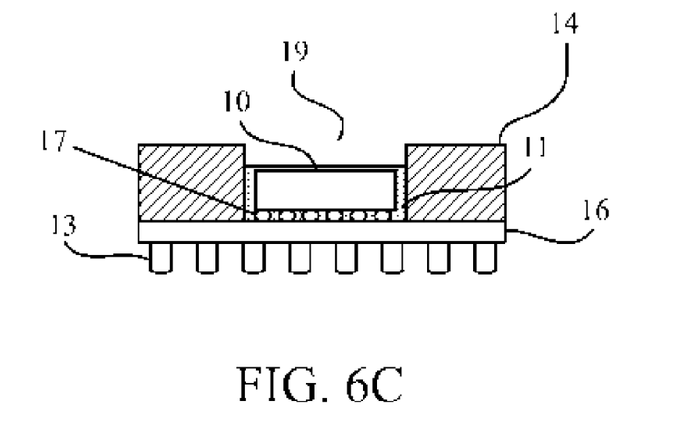
Figure 6D:
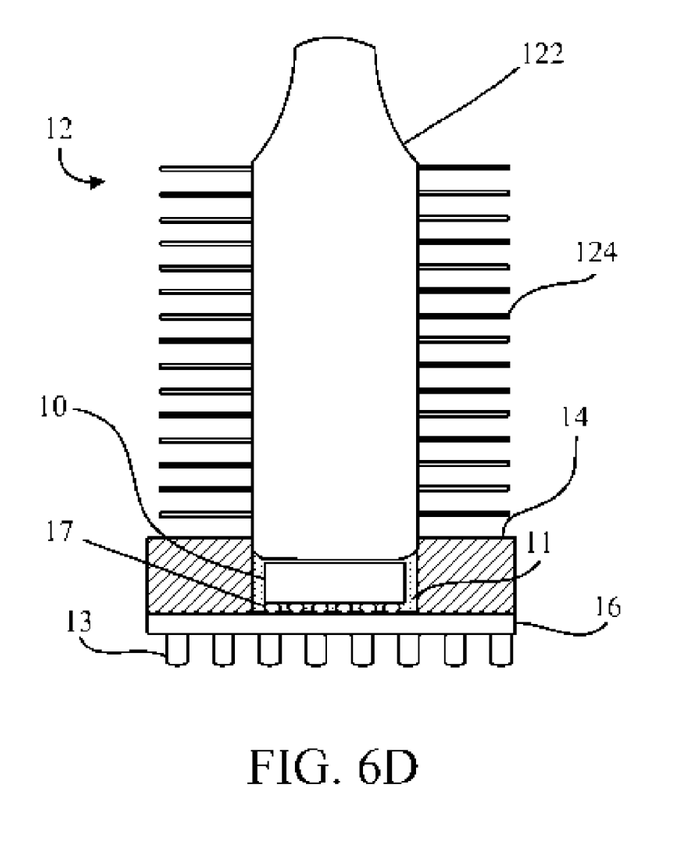
Figure 6E:
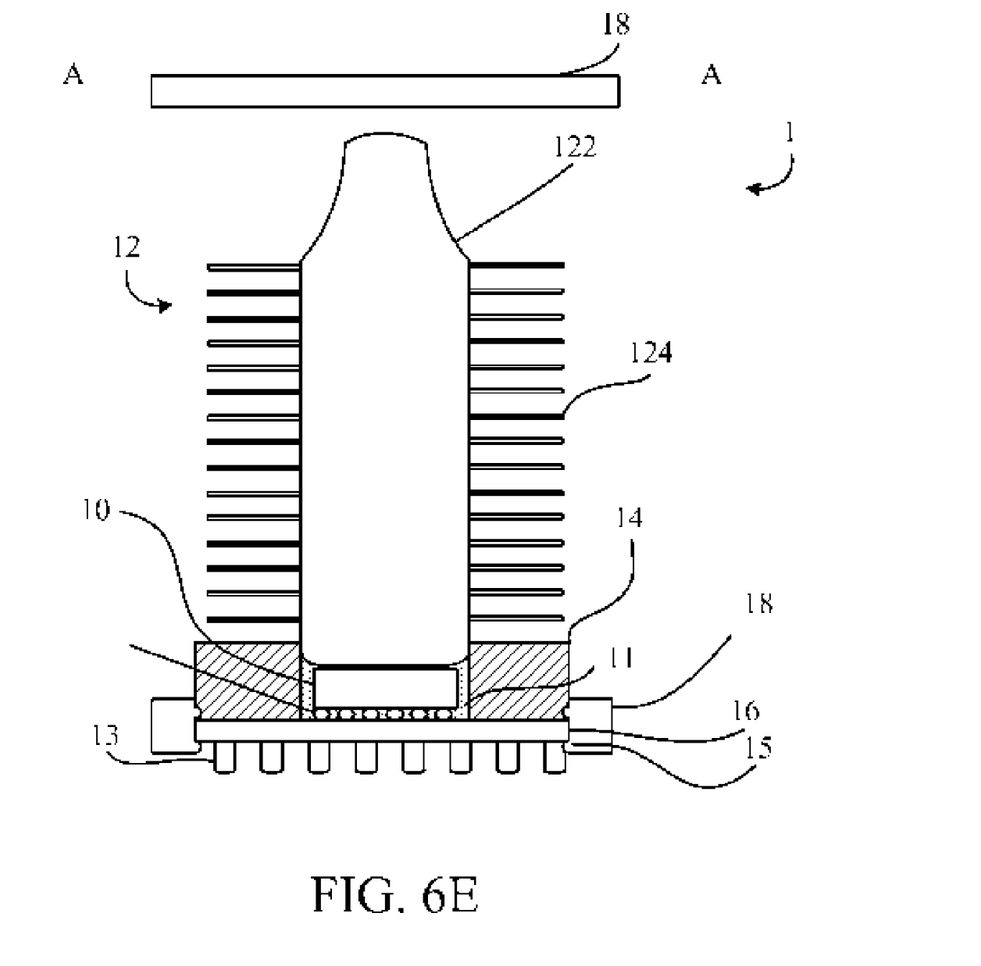

Referring to FIG. 6A, as shown in FIG. 6A, the method is, first, to form a protection layer 14 on the substrate 16. The protection layer 14 substantially covers the first surface of the substrate 16 and has an opening 19, of which the area is substantially equal to that of the end surface of the heat-dissipating module 12. The inner circuit is disposed and exposed in the opening 19. As shown in FIG. 6B, the semiconductor die 10 is mounted into the opening 19 of the protection layer 14 by a flip-chip process, such that the plurality of bond pads 17 contact the inner circuit on the substrate 16. Since the area of the opening 19 is larger than that of the back surface of the semiconductor die 10, a gap 11 exists between the semiconductor die 10 and the protection layer 14. Referring to FIG. 6C, as shown in FIG. 6C, thermal adhesive is used to fill up the gap 11 to enhance heat dissipating. As shown in FIG. 6D, the heat-dissipating module 12, via the distal end thereof, is inserted into the opening of the protection layer 14. The heat-dissipating module 12 includes a heat-conducting device 122 and a plurality of heat-dissipating fins 124. The heat-conducting device 122 has a flat end surface at a distal thereof. The heat-dissipating fins 124 are disposed around the circumference of the heat-conducting device 122 to enhance heat dissipating. The heat-conducting device 122 contacts and bonds the flat end surface thereof with the back surface of the semiconductor die 10. Finally, as shown in FIG. 6E, a casing 18 encloses the heat-dissipating module 12, the protection layer 14, and the substrate 16 to complete the IC packing structure 1. The casing has a top surface for heat conducting, which can be configured with other heat-dissipating devices to enhance the heat-dissipating effect.

Figure 7:
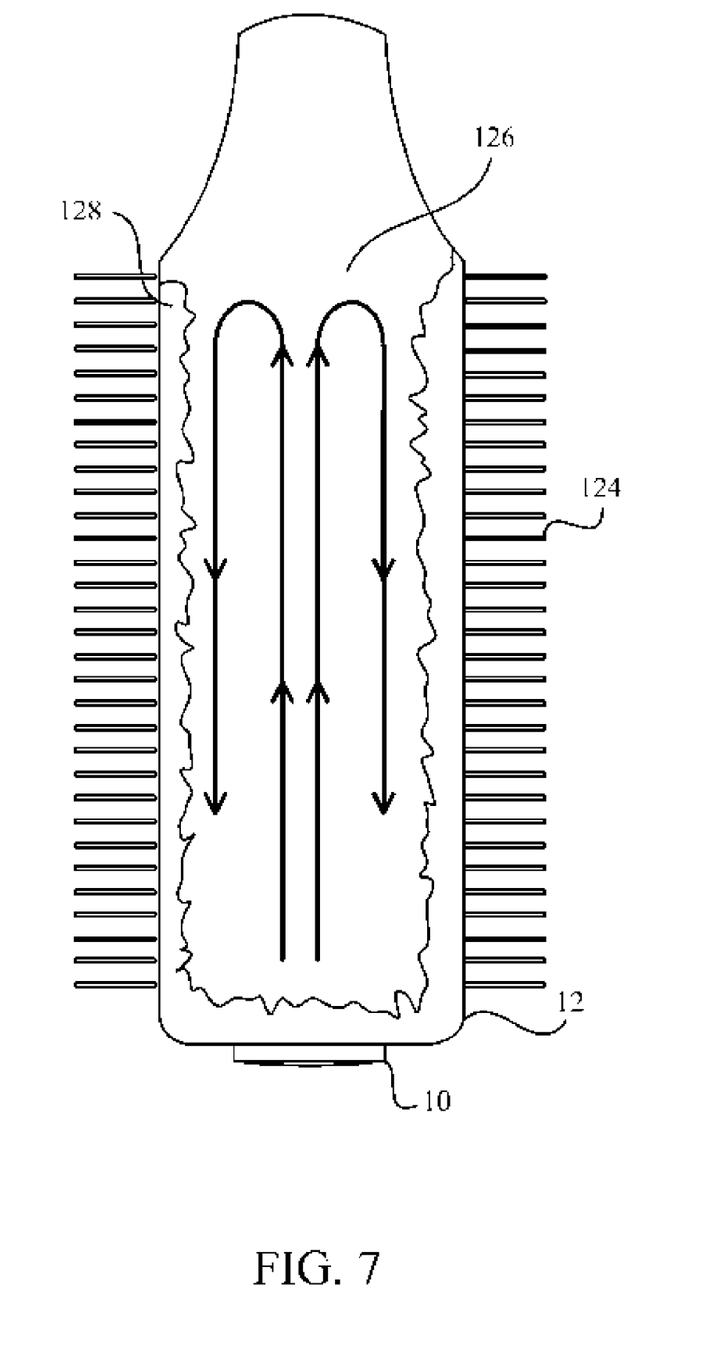
FIG. 7 illustrates the heat dissipating mechanism of the heat-dissipating module.

Referring to FIG. 7, FIG. 7 illustrates the heat dissipating mechanism of the heat-dissipating module. As shown in FIG. 7, the heat-dissipating module 12 includes the heat-conducting device 122 and a plurality of heat-dissipating fins 124. In practical application, the heat-conducting device 122 can be a heat column or a heat pipe made of copper. The heat-conducting device 122 includes a working fluid 126 and a capillary structure 128. The heat-dissipating fins 124 are disposed around the circumference of the heat-dissipating device 122 to enhance heat dissipating. When heat is produced by the semiconductor die 10, the working fluid 126 near the semiconductor die 10 in the heat-conducting device 122 vaporizes from liquid phase to vapor phase. The evaporated working fluid 126 transmits the heat to the other end of the heat-conducting device 122. The working fluid 126 will condense to liquid phase after the heat is dissipated through the heat-dissipating fins 124. The capillary structure 128 transmits the condensed working fluid 126 to the zone near the semiconductor die 10 in the heat-conducting device 122. The heat-conducting and heat-dissipating effect will be achieved by circulation, as shown in FIG. 7.

Because the IC packing structure of the invention bonds the heat-dissipating module with the semiconductor die, the heat-dissipating module directly dissipates the heat produced by the semiconductor die to the surrounding air via heat-dissipating fins and thermal adhesive, which greatly improves the heat-dissipating efficiency. The improvement of the heat-dissipating efficiency of semiconductor devices solves the issue of performance reduction of the semiconductor devices due to overheating. Therefore, comparing with the prior art, the IC packing structure of the invention is more suitable to the application of high power semiconductor devices.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A chip-level packaging integrated circuit packaging structure, comprising:
   a substrate having a first surface, an inner circuit formed on the first surface, a second surface opposite to the first surface, and an outer circuit with a plurality of connecting pins formed on the second surface and electrically connected to the inner circuit;
   a bare semiconductor die without lead frame having an active surface and a back surface opposite to the active surface, a plurality of bond pads formed on the active surface, the bare semiconductor die being mounted on the first surface of the substrate such that the plurality of bond pads contact the inner circuit;
   a heat-dissipating module comprising a heat pipe and a plurality of heat dissipating fins punched through by the heat pipe, the heat pipe having a flat end surface and a cylindrical surface and comprising a capillary structure and a working fluid sealed therein, the capillary structure formed on both an inner wall of the cylindrical surface and an inner wall of the flat end surface, wherein the flat end surface of the heat pipe directly bonding to the back surface of the bare semiconductor die;
   a protection encapsulation accommodating the bare semiconductor die, the flat end surface and a portion of the cylindrical surface of the heat pipe, wherein the cylindrical surface of the heat pipe passes through a upper surface of the protection encapsulation and the upper surface of the protection encapsulation not directly contacting with the flat end surface of the heat pipe; and
   a casing including a top cap, a lower cap opposite to the top cap and a side frame connected to the top cap and the lower cap, the casing enclosing the heat-dissipating module, the protection encapsulation and the substrate, wherein the lower cap has a hole and the plurality of connecting pins of the outer circuit of the substrate extends out of the hole.

2. The chip-level packaging integrated circuit packaging structure of claim 1, wherein the casing has an opening and a retainer formed on the inner wall of the opening for clamping with the substrate.

3. The chip-level packaging integrated circuit packaging structure of claim 1, a thermal adhesive filled among the protection layer, the bare semiconductor die, the flat end surface and the portion of the cylindrical surface of the heat pipe.

4. A chip-level packaging integrated circuit packaging structure, comprising:
   a substrate circuit having a first surface and a second surface opposite to the first surface, wherein a plurality of connecting pads formed on the first surface and a plurality of connecting pins formed on the second surface;
   a bare semiconductor die without lead frame having an active surface and a back surface opposite to the active surface, a plurality of bond pads formed on the active surface and the plurality of bond pads of the bare semiconductor die being mounted on the plurality of connecting pads of the substrate;
   a heat-dissipating module comprising a heat pipe and a plurality of heat dissipating fins punched through by the heat pipe, the heat pipe having a flat end surface and a cylindrical surface and comprising a capillary structure and a working fluid sealed therein, the capillary structure formed on both an inner wall of the cylindrical surface and an inner wall of the flat end surface, wherein the flat end surface of the heat pipe directly adhesive to the back surface of the bare semiconductor die;
   a protection encapsulation accommodating the bare semiconductor die, the flat end surface and a portion of the cylindrical surface of the heat pipe, wherein the cylindrical surface of the heat pipe passes through the protection encapsulation and no air within the protection encapsulation;
   a thermal adhesive filled among the first surface of the substrate, protection encapsulation, the bare semiconductor die and the flat end surface of the heat pipe, wherein no spare space therebetween; and
   a casing including a top cap, a lower cap opposite to the top cap and a side frame connected to the top cap and the lower cap, the casing enclosing the heat-dissipating module, the protection encapsulation and the substrate, wherein the lower cap has a hole and the plurality of connecting pins of the outer circuit of the substrate extends out of the hole.

5. The chip-level packaging integrated circuit packaging structure of claim 4, wherein the casing has an opening and a retainer formed on the inner wall of the opening for clamping with the substrate.

* * * * *